US009275181B2

(12) United States Patent
Huang et al.

(10) Patent No.: US 9,275,181 B2
(45) Date of Patent: Mar. 1, 2016

(54) CELL DESIGN

(71) Applicant: Taiwan Semiconductor Manufacturing Company Limited, Hsin-Chu (TW)

(72) Inventors: Chia-En Huang, Hsinchu (TW); Yi-Hung Tsai, Hsinchu (TW); Chih-Chieh Chiu, Hsinchu (TW); Hsiao-Lan Yang, Taipei (TW); I-Han Huang, Tainan (TW); Chun-Jiun Dai, Taichung (TW); Fu-An Wu, Hsinchu (TW); Hong-Chen Cheng, Hsinchu (TW); Jung-Ping Yang, Jui-bei (TW); Cheng Hung Lee, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/623,978

(22) Filed: Sep. 21, 2012

(65) Prior Publication Data

US 2014/0084374 A1 Mar. 27, 2014

(51) Int. Cl.
*H01L 21/70* (2006.01)
*G06F 17/50* (2006.01)
*H01L 27/088* (2006.01)
*H01L 27/02* (2006.01)
*H01L 27/11* (2006.01)

(52) U.S. Cl.
CPC ........ *G06F 17/5068* (2013.01); *H01L 27/0207* (2013.01); *H01L 27/088* (2013.01); *H01L 27/1104* (2013.01)

(58) Field of Classification Search
CPC ....... H01L 27/88; H01L 21/336; H01L 29/66; H01L 21/823418; H01L 29/0873; H01L 29/66659
USPC ................. 257/382, E29.021, 288, 368, 369; 438/151, 197, 199
See application file for complete search history.

(56) References Cited

U.S. PATENT DOCUMENTS

| | | | |
|---|---|---|---|
| 5,847,998 A * | 12/1998 | Van Buskirk | 365/185.33 |
| 8,299,564 B1 * | 10/2012 | Wu et al. | 257/509 |
| 2007/0204250 A1 * | 8/2007 | Moroz et al. | 716/10 |
| 2007/0253239 A1 * | 11/2007 | Wang et al. | 365/154 |
| 2013/0026465 A1 * | 1/2013 | Chang et al. | 257/48 |
| 2014/0045310 A1 * | 2/2014 | Chuang et al. | 438/268 |
| 2014/0131708 A1 * | 5/2014 | Chang et al. | 257/48 |

* cited by examiner

*Primary Examiner* — Jarrett Stark
*Assistant Examiner* — Shahed Ahmed
(74) *Attorney, Agent, or Firm* — Cooper Legal Group, LLC

(57) ABSTRACT

One or more techniques or systems for designing a cell are provided. The cell generally includes one or more transistors, such as a pass gate transistor, a pull up transistor, or a pull down transistor, respectively associated one or more gate to gate distances. In some embodiments, a second gate to gate distance is selected based on a first gate to gate distance. For example, the first gate to gate distance and the second gate to gate distance are associated with a first transistor. In another example, the first gate to gate distance is associated with a first transistor and the second gate to gate distance is associated with a second transistor. In this manner, a cell design is provided to improve a static noise margin (SNM) or a write margin (WM) for the cell, for example.

20 Claims, 9 Drawing Sheets

CELL DESIGN

BACKGROUND

Generally, a cell, such as a static random access memory (SRAM) cell comprises one or more transistors. In an example, an SRAM cell is a bit-cell comprising one or more transistors. In this manner, an SRAM cell is at times referred to as an SRAM bit-cell. In an example, an SRAM cell or SRAM bit-cell comprises a pass gate transistor, a pull up transistor, or a pull down transistor. Performance associated with the SRAM cell is generally associated with at least one of an alpha ratio, a beta ratio, a static noise margin (SNM), a write margin (WM), or a Vccmin voltage. Generally, a Vccmin voltage is a minimum voltage that a cell operates at reliably, for example. However, improvement in one feature of the SRAM cell, such as the alpha ratio, is generally associated with a decline in another feature of the SRAM cell, such as the beta ratio and vice versa, for example.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques and systems for designing a cell are provided herein. In some embodiments a cell is a static random access memory (SRAM) cell. In an example, an SRAM cell is a bit-cell comprising one or more transistors. In this manner, an SRAM cell is at times referred to as an SRAM bit-cell. Additionally, an SRAM cell design associated with at least one of an improved alpha ratio, beta ratio, static noise margin (SNM), write margin (WM), or Vccmin voltage for the SRAM cell is provided herein. For example, in some embodiments, transistors within an SRAM cell are designed in an asymmetric fashion such that not all transistors within the SRAM cell are symmetrical or identical. In other words, a second transistor is associated with a first gate to gate distance and a second gate to gate distance such that the first gate to gate distance is different than the second gate to gate distance. For example, when a first transistor comprising a first gate is adjacent to a second transistor comprising a second gate, and the second transistor is adjacent to a third transistor comprising a third gate, a first gate to gate distance is a distance from the first gate of the first transistor to the second gate of the second transistor and a second gate to gate distance is a distance from the second gate of the second transistor to the third gate of the third transistor. Therefore, the second transistor is asymmetrical at least because the first gate to gate distance is different than or not equal to the second gate to gate distance of the second transistor. For example, increasing the first gate to gate distance between the first gate of first transistor and the second gate of the second transistor creates a higher strain effect for at least one of the first transistor or the second transistor, thus reducing the effective resistance for respective transistors. Accordingly, the asymmetric design of the second transistor enables a feature, such as at least one of the alpha ratio, the beta ratio, the SNM, the WM, or Vccmin voltage, to be improved. For example, the alpha ratio is improved such that the beta ratio is not impacted in a negative fashion, at least because the first gate to gate distance and the second gate to gate distance of the second transistor are asymmetrical. In this way a second transistor design of the second transistor decouples the alpha ratio and the beta ratio.

The following description and annexed drawings set forth certain illustrative aspects and implementations. These are indicative of but a few of various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
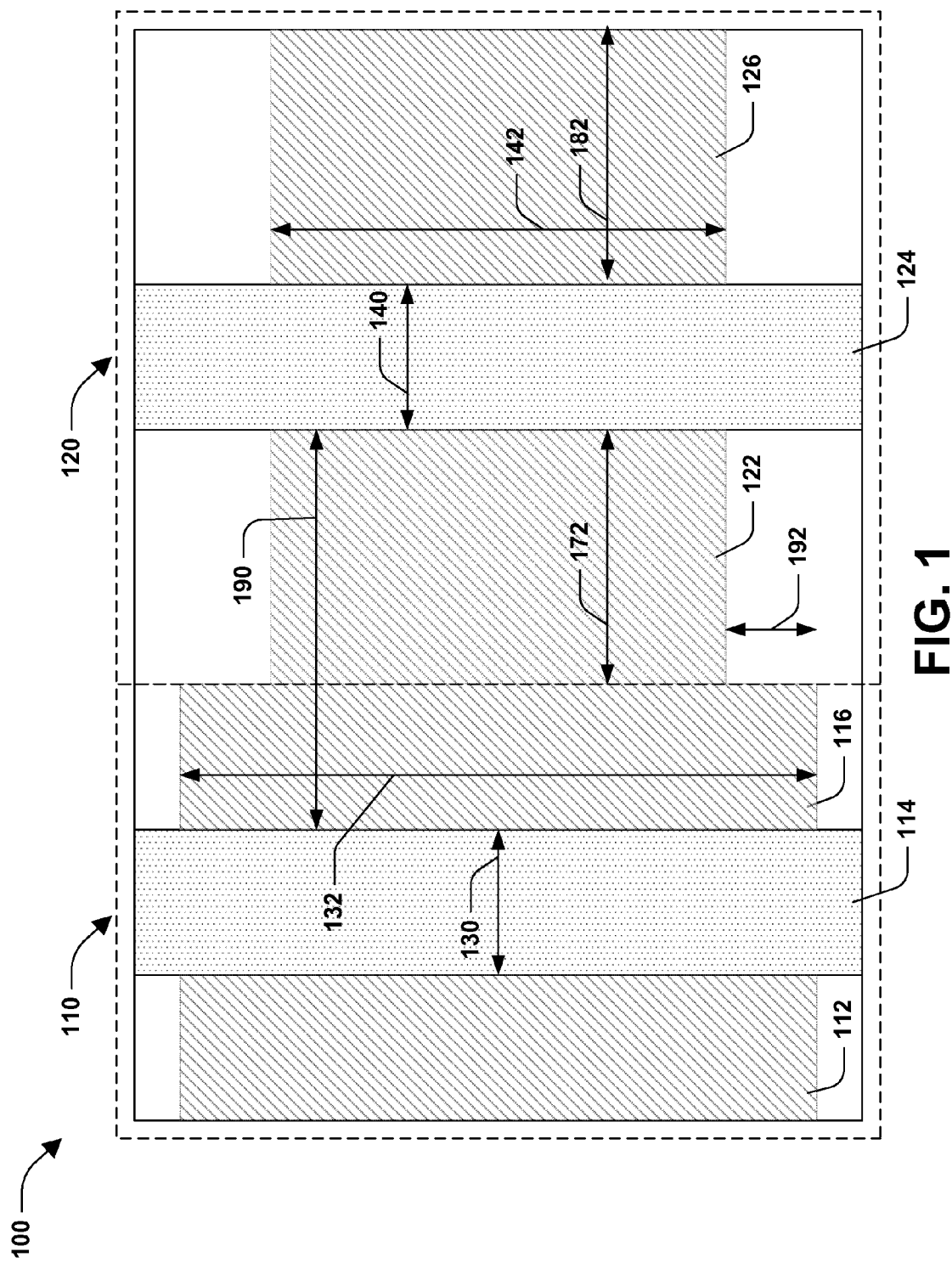
FIG. 1 is a top-down or layout view of an example transistor array of a cell, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

FIG. 1 is a top-down or layout view of an example transistor array 100 of a cell according to some embodiments. In some embodiments, the cell is a static random access memory (SRAM) cell. Other types of cells are within the scope of various embodiments. In some embodiments, the transistor array 100 of the SRAM cell comprises a first transistor 110 and a second transistor 120. Additionally, the first transistor 110 comprises a first gate 114, a first region 112, and a second region 116 and the second transistor 120 comprises a second gate 124, a third region 122, and a fourth region 126. In some embodiments, the first region 112 is a source region for the first transistor 110 and the second region 116 is a drain region for the first transistor 110. In other embodiments, the first region 112 is the drain region for the first transistor 110 and the second region 116 is the source region for the first transistor 110. In some embodiments, the third region 122 is a source region for the second transistor 120 and the fourth region 126 is a drain region for the second transistor 120. In other embodiments, the third region 122 is the drain region for the second transistor 120 and the fourth region 126 is the source region for the second transistor 120.

In some embodiments, the first transistor 110 is associated with a first length 130, a first width 132, a first width to length ratio, a gate to gate distance 190, a first I-V characteristic, a first effective resistance, a first source effective resistance, a first drain effective resistance, or a first transistor design. It will be appreciated that while a transistor, such as the first transistor 110, is at times said to be associated with a gate to gate distance herein, that such language or similar language does not mean to imply that a single transistor defines a gate to gate distance. Rather, a gate to gate distance is a function of two transistors because a gate to gate distance is a distance from a gate of one transistor to a gate of another transistor. Thus, while language such as transistor associated with gate to gate distance or the like is at times used herein, it is to be appreciated that the gate to gate distance is not associated with merely a single transistor but is also associated with or a function of an adjacent transistor. It will be appreciated that the first width to length ratio is determined by dividing the first width 132 by the first length 130. In some embodiments, the second transistor 120 is associated with a second length 140, a second width 142, a second width to length ratio, the gate to gate distance 190, a second I-V characteristic, a second effective resistance, a second source effective resistance, a second drain effective resistance, or a second transistor design. For example, the second width to length ratio is determined by dividing the second width 142 by the second length 140. Generally, a transistor comprises an oxide diffusion region (OD), for example. In some embodiments, at least one of the first width 132 or the second width 142 is selected or adjusted by changing an OD to OD distance 192. For example, the OD to OD distance 192 is a distance associated with an OD spacing effect, at least because the first transistor 110 comprises the first width 132 and the second transistor 120 comprises the second width 142 different than the first width 132.

In some embodiments, at least one of the first I-V characteristic, second I-V characteristic, first effective resistance, the second effective resistance, the first source effective resistance, the second source effective resistance, the first drain effective resistance, or the second drain effective resistance is selected or adjusted by adjusting the gate to gate distance 190. For example, the gate to gate distance 190 is a distance from the first gate 114 of the first transistor 110 to the second gate 124 of the second transistor 120. Increasing the gate to gate distance 190 from the first gate 114 of the first transistor 110 to the second gate 124 of the second transistor 120 increases a strain effect associated with the first transistor 110 and the second transistor 120, thus decreasing the first effective resistance and the second effective resistance. In an example, if the second region 116 of the first transistor 110 is a source region and the gate to gate distance 190 is increased, the strain effect associated with the first transistor 110 is increased, thus decreasing a first source effective resistance associated with the source region, such as the second region 116. Conversely, decreasing the gate to gate distance 190 from the first gate 114 of the first transistor 110 to the second gate 124 of the second transistor 120 decreases the strain effect associated with the first transistor 110 and the second transistor 120, thus increasing the first effective resistance and the second effective resistance.

In an example, the second region 116 of the first transistor 110 is a source region and the gate to gate distance 190 is decreased. Accordingly, a strain effect associated with the first transistor 110 is decreased, thus increasing a first source effective resistance associated with the source region, such as the second region 116. It will be appreciated that at least one of a first drain effective resistance, a second source effective resistance, or a second drain effective resistance is determined in a similar fashion based on at least one of an increase or decrease in the gate to gate distance 190, for example. Accordingly, it will be appreciated that the gate to gate distance 190 is selected to control at least one of the first effective resistance, first source effective resistance, first drain effective resistance of the first transistor 110, second effective resistance, second source effective resistance, or second drain effective resistance of the second transistor 120.

In some embodiments, a beta ratio or cell ratio associated with a SRAM cell is equal to a width to length ratio of a pull down transistor of the SRAM cell divided by a width to length ratio of a pass gate transistor of the SRAM cell. Additionally, the beta ratio associated with the SRAM cell is equal to an effective resistance of the pass gate transistor of the SRAM cell divided by an effective resistance of the pull down transistor of the SRAM cell. In some embodiments, an alpha ratio or a pull up ratio associated with a SRAM cell is equal to a width to length ratio of a pull up transistor of the SRAM cell divided by a width to length ratio of a pass gate transistor of the SRAM cell. Additionally, the alpha ratio associated with the SRAM cell is equal to an effective resistance of the pass gate transistor of the SRAM cell divided by an effective resistance of the pull up transistor of the SRAM cell. In some embodiments, the beta ratio is larger and the alpha ratio is smaller. For example, a larger beta ratio improves a static noise margin (SNM) of the SRAM cell and a smaller alpha ratio improves a write margin (WM) of the SRAM cell. Accordingly, the larger beta ratio or the smaller alpha ratio enables a reduction of a Vccmin voltage for the SRAM cell. As an example, an SRAM cell comprises a pull down transistor, a pull up transistor, and a pass gate transistor. In this example, $W_{PD}$=a width of the pull down transistor,
$L_{PD}$=a length of the pull down transistor,
$W_{PU}$=a width of the pull up transistor,
$L_{PG}$=a length of the pull up transistor,
$W_{PG}$=a width of the pass gate transistor,
$L_{PG}$=a length of the pass gate transistor,
$R_{PD}$=an effective resistance of the pull down transistor,
$R_{PU}$=an effective resistance of the pull up transistor,
$R_{PG}$=an effective resistance of the pass gate transistor.
$\beta$=beta ratio=$(W_{PD}/L_{PD})/(W_{PG}/L_{PG})=R_{PG}/R_{PD}$, and
$\alpha$=alpha ratio=$(W_{PU}/L_{PU})/(W_{PG}/L_{PG})=R_{PG}/R_{PU}$.

Generally, the beta ratio is increased by at least one of increasing an effective resistance of the pass gate transistor ($R_{PG}$) relative to an effective resistance of the pull down transistor ($R_{PD}$) or decreasing the effective resistance of the pull down transistor ($R_{PD}$) relative to the effective resistance of the pass gate transistor ($R_{PG}$).

Generally, the alpha ratio is decreased by at least one of decreasing an effective resistance of the pass gate transistor ($R_{PG}$) relative to an effective resistance of the pull up transistor ($R_{PU}$) increasing the effective resistance of the pull up transistor ($R_{PU}$) relative to the effective resistance of the pass gate transistor ($R_{PG}$).

In some embodiments, a transistor is designed such that an effective resistance of the transistor changes based on at least one of a forward read current associated with a read operation for the transistor or a reverse read current associated with a write operation for the transistor. For example, a pass gate transistor is designed such that a forward read current of the pass gate transistor is greater than a reverse read current of the pass gate transistor. In some embodiments, the forward read current flows from a drain of the pass gate transistor to a source of the pass gate transistor. Conversely, the reverse read current of the pass gate transistor flows from the source of the pass gate transistor to the drain of the pass gate transistor. In some embodiments, the forward read current is greater than the reverse read current when an effective resistance of the drain is greater than an effective resistance of the source. In other words, where $R_{CH}$=a resistance of a channel of a transistor,
$R_{JS}$=a resistance of a junction of a source of the transistor,
$R_{CS}$=a resistance of a contact of the source of the transistor,
$R_{JD}$=a resistance of a junction of a drain of the transistor,
$R_{CD}$=a resistance of contact of the drain of the transistor,
a pass gate transistor design of a pass gate transistor associated with:
($R_{CD}$+$R_{JD}$)>($R_{CS}$+$R_{JS}$) enables the forward read current to be greater than the reverse read current of the pass gate transistor.

Accordingly, a pass gate transistor following such a pass gate transistor design is associated with a forward read current greater than a reverse read current. For example, the forward read current or a forward operation is associated with current flowing from the drain of the transistor to the source of the transistor. Additionally, the reverse read current or reverse operation is associated with current flowing from the source of the transistor to the drain of the transistor. Therefore, when current flows from the source of the pass gate transistor to the drain of the pass gate transistor, the pass gate transistor, as a whole, is associated with a higher effective resistance than when current flows from the drain of the pass gate transistor to the source of the pass gate transistor, thus improving the beta ratio by exhibiting an increased effective resistance during reverse operation, such as a read operation, for example. Conversely, when current flows from the drain of the pass gate transistor to the source of the pass gate transistor, the pass gate transistor, as a whole, is associated with a lower effective resistance than when current flows from the source of the pass gate transistor to the drain of the pass gate transistor, thus improving the alpha ratio by exhibiting a decreased effective resistance, as a whole, during reverse operation, such as a write operation, for example.

In some embodiments, a second effective resistance of a second transistor 120 is selected based on a first effective resistance of a first transistor 110. In some embodiments, the second effective resistance of the second transistor 120 is selected based on a gate to gate distance 190 from the first transistor 110 to the second transistor 120. It will be appreciated that at least one of a second source effective resistance or a second drain effective resistance are selected in a similar fashion. In some embodiments, the second effective resistance is different than the first effective resistance. For example, if the first transistor 110 is a pass gate transistor and the second transistor 120 is a pull up transistor, the first effective resistance of the first pass gate transistor 110 is selected based on the second effective resistance of the second pull up transistor. For example, the first effective resistance is selected to be four times less than the second effective resistance at least because this selection results in an alpha ratio of 0.25, for example.

Figure 2:
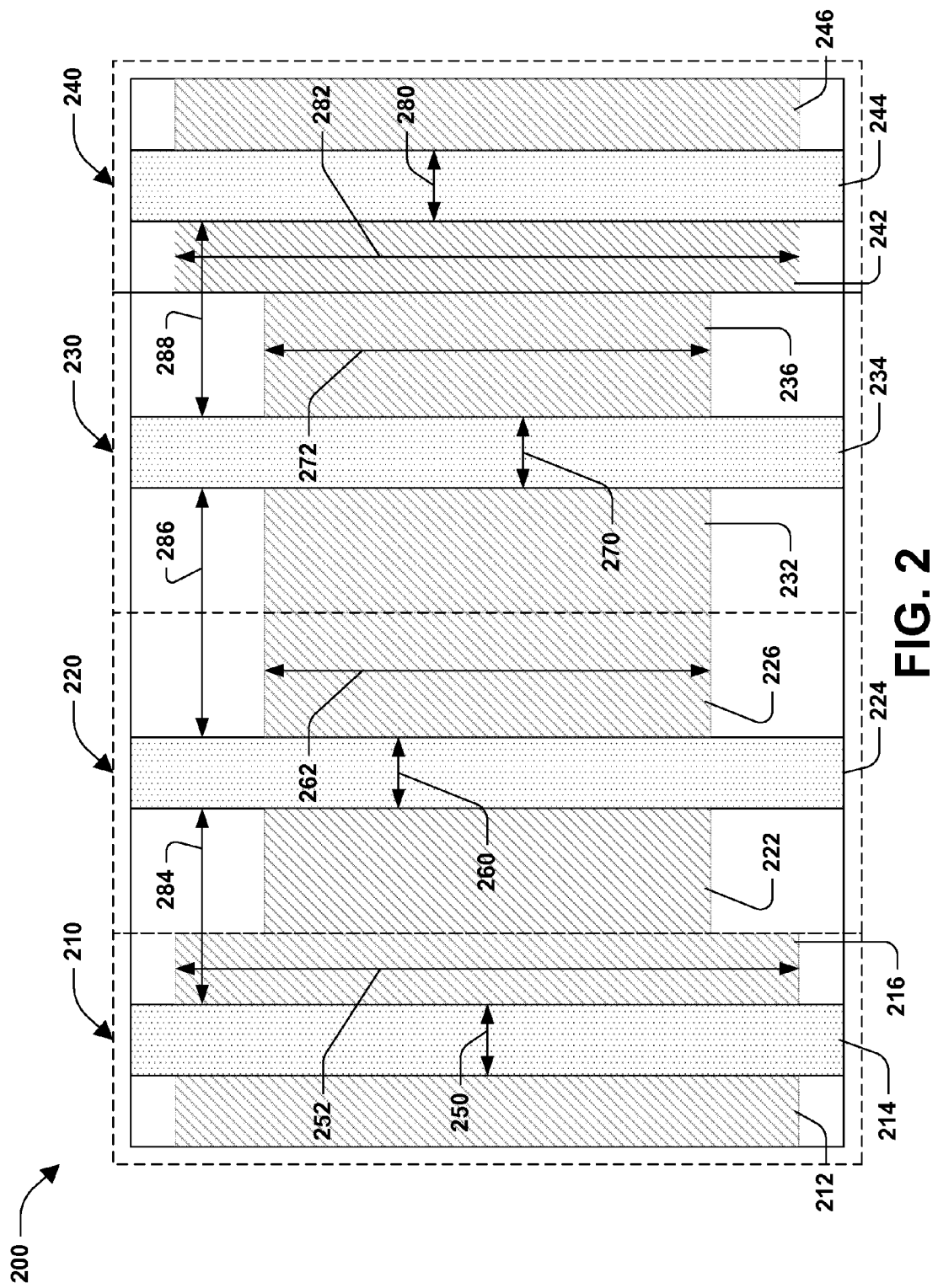
FIG. 2 is a top-down or layout view of an example transistor array of a cell, according to some embodiments.

In some embodiments, transistors within an SRAM cell are designed in an asymmetric fashion such that a first transistor and a second transistor of the SRAM cell, such as transistors 110 and 120, do not comprise a first gate to gate distance being equal to a second gate to gate distance, such as the first gate to gate distance 284 and the second gate to gate distance 286 of FIG. 2. In some embodiments, the second transistor 120 is associated with an asymmetrical design when viewed using gate 124 as a line of symmetry, for example. In some embodiments, an increase in the gate to gate distance 190 is associated with an increase in distance 172, but not in distance 182 such that distance 172 is different than distance 182. Transistor 120 can thus be regarded as having an asymmetrical configuration or asymmetrical design because 172 and 182 are not equal. In some embodiments, the first transistor of the SRAM cell, such as transistor 110 does not comprise an identical set of characteristics as a second transistor of the SRAM cell, such as transistor 120. In some embodiments, the set of characteristics comprises at least one of a width, a width to length ratio, a contact length, a contact width, a contact area, a contact shape, an effective resistance, a tensile effect, such as a tensile stress, a strain effect, a compressive effect, etc. of a transistor, for example. Additionally, the set of characteristics comprises at least one of a gate spacing effect based on a gate to gate distance or an oxide diffusion region (OD) spacing effect associated with an OD to OD distance 192. Accordingly, the asymmetric design of the transistor array 100 facilitates an increase in current to the SRAM cell. In some embodiments, the asymmetric design of the transistor array 100 mitigates leakage in a corresponding bit line, at least due to an improvement in at least one of an alpha ratio, a beta ratio, a static noise margin (SNM), a write margin (WM), or a Vccmin voltage. It will be appreciated that the design of the transistor array 100 enables the alpha ratio to be selected independent of the beta ratio and vice versa, at least because the asymmetric design of the transistor array 100 decouples the alpha ratio and the beta ratio. According to some embodiments, the improvement to at least one of the alpha ratio, the beta ratio, the SNM, the WM, or the Vccmin voltage is permanent at least because a layout or the design of the transistor array 100 is modified. Additionally, it will be appreciated that there is generally little or no cost associated with such a layout modification or design modification.

In some embodiments, at least one of the first transistor 110 or the second transistor 120 is at least one of a pull up transistor, a pull down transistor, or a pass gate transistor, as will be described in FIG. 7, for example. In some embodiments, a drain of the pull down transistor is connected to at least one of a source or a drain of the pass gate transistor. In some embodiments, a drain of the pull up transistor is connected to at least one of the source or the drain of the pass gate transistor. It will be appreciated that in some embodiments, a first transistor design or a second transistor design results in a transistor array design where the first transistor 110 is asymmetrical with respect to the second transistor 120. For example, a first width 132 of the first transistor 110 is not equal to a second width 142 of the second transistor 120. In some embodiments, it will be appreciated that the first length 130 of the first transistor 110 is equal to the second length 140 of the second transistor 120, while the first width 132 of the first transistor 110 is not equal to the second width 142 of the second transistor 120. In other words, merely the first width 132 and the second width 142 are adjusted or selected to be different.

FIG. 2 is a top-down or layout view of an example transistor array 200 of a cell, such as a static random access memory (SRAM) cell, according to some embodiments. In some embodiments, the transistor array 200 comprises a first transistor 210, a second transistor 220, a third transistor 230, and a fourth transistor 240. For example, the first transistor 210 comprises a first gate 214, a first region 212, a second region 216, a first length 250, a first width 252, a first width to length ratio, a first effective resistance, a first source effective resistance, and a first drain effective resistance. The first transistor 210 is associated with a first gate to gate distance 284 from the first gate 214 of the first transistor 210 to the second gate 224 of the second transistor 220. Additionally, the second transistor 220 comprises a second gate 224, a first region 222, a second region 226, a second length 260, a second width 262, a second width to length ratio, a second effective resistance, a second source effective resistance, and a second drain effective resistance. The second transistor 220 is associated with the first gate to gate distance 284 from the first gate 214 of the first transistor 210 to the second gate 224 of the second transistor 220 and a second gate to gate distance 286 from the second gate 224 of the second transistor 220 to a third gate 234 of the third transistor 230. Additionally, the third transistor 230 comprises a third gate 234, a first region 232, a second region 236, a third length 270, a third width 272, a third width to length ratio, a third effective resistance, a third source effective resistance, and a third drain effective resistance. The third transistor 230 is associated with the second gate to gate distance 286 from the second gate 224 of the second transistor 220 to the third gate 234 of the third transistor 230 and a third gate to gate distance 288 from the third gate 234 of the third transistor 230 to a fourth gate 244 of the fourth transistor 240. For example, the fourth transistor 240 comprises a fourth gate 244, a first region 242, a second region 246, a fourth length 280, a fourth width 282, a fourth width to length ratio, a fourth effective resistance, a fourth source effective resistance, and a fourth drain effective resistance. The fourth transistor 240 is associated with the third gate to gate distance 288 from the third gate 234 of the third transistor 230 to the fourth gate 244 of the fourth transistor 240. In some embodiments, the first transistor 210 is adjacent to the second transistor 220, the second transistor 220 is adjacent to the third transistor 230, and the third transistor 230 is adjacent to the fourth transistor 240.

In some embodiments, at least one of the first transistor 210, the second transistor 220, the third transistor 230, or the fourth transistor 240 is configured to be at least one of a pass gate transistor, a pull up transistor, or a pull down transistor. In some embodiments, the first region 212 is a source region for the first transistor 210 and the second region 216 is a drain region for the first transistor 210. In other embodiments, the first region 212 is the drain region for the first transistor 210 and the second region 216 is the source region for the first transistor 210. In some embodiments, the first region 222 is a source region for the second transistor 220 and the second region 226 is a drain region for the second transistor 220. In other embodiments, the first region 222 is the drain region for the second transistor 220 and the second region 226 is the source region for the second transistor 220. In some embodiments, the first region 232 is a source region for the third transistor 230 and the second region 236 is a drain region for the third transistor 230. In other embodiments, the first region 232 is the drain region for the third transistor 230 and the second region 236 is the source region for the third transistor 230. In some embodiments, the first region 242 is a source region for the fourth transistor 240 and the second region 246 is a drain region for the fourth transistor 240. In other embodiments, the first region 242 is the drain region for the fourth transistor 240 and the second region 246 is the source region for the fourth transistor 240. In some embodiments, the first width to length ratio is determined by dividing the first width 252 of the first transistor 210 by the first length 250 of the first transistor 210. Additionally, the second width to length ratio is determined by dividing the second width 262 of the second transistor 220 by the second length 260 of the second transistor 220. Additionally, the third width to length ratio is determined by dividing the third width 272 of the third transistor 230 by the third length 270 of the third transistor 230. Additionally, the fourth width to length ratio is determined by dividing the fourth width 282 of the fourth transistor 240 by the fourth length 280 of the fourth transistor 240.

It will be appreciated that at least one of a source effective resistance, a drain effective resistance, or an effective resistance of a transistor is based on a selection of a gate to gate distance associated with the transistor. For example, the second transistor 220 is associated with a first gate to gate distance 284 and a second gate to gate distance 286. When at least one of the first gate to gate distance 284 or the second gate to gate distance 286 is increased, a higher strain effect is induced for the second transistor 220, thus reducing a second effective resistance for the second transistor 220. Additionally, when a first gate to gate distance 284 of the second transistor 220 is different than a second gate to gate distance 286 for the second transistor 220, the second transistor 220 is associated with an asymmetric set of I-V characteristics. For example, the second transistor 220 is associated with a first I-V characteristic associated with the first gate to gate distance 284 and a second I-V characteristic associated with the second gate to gate distance 286. In some embodiments, the first I-V characteristic is different than or asymmetrical with regard to the second I-V characteristic at least because the first gate to gate distance 284 is different than the second gate to gate distance 286. In some embodiments, at least one of the first I-V characteristic or the second I-V characteristic is an effective resistance, such as at least one of the second effective resistance, the second source effective resistance, or the second drain effective resistance. Therefore, the second transistor 220 is associated with the second source effective resistance. In some embodiments, the second source effective resistance is an effective resistance associated with a source of the second transistor 220 and the second drain effective resistance is an effective resistance associated with a drain of the second transistor 220. Accordingly, a difference in the second source effective resistance and the second drain effective resistance results in a difference in a forward I-V characteristic for the second transistor 220 and a reverse I-V characteristic for the second transistor 220.

In some embodiments, when an effective resistance of a drain of a pass gate transistor is greater than an effective resistance of a source of the pass gate transistor, a forward read current for the pass gate transistor is greater than a reverse read current. For example, the forward read current is associated with current flowing from the drain of the transistor to the source of the transistor and a read operation or a forward operation mode. Additionally, the reverse read current is associated with current flowing from the source of the transistor to the drain of the transistor and a write operation or a reverse operation mode. Accordingly, when current flows from the source of the pass gate transistor to the drain of the pass gate transistor, the pass gate transistor, as a whole, comprises a greater effective resistance than when current flows from the drain of the pass gate transistor to the source of the pass gate transistor, thus improving the beta ratio, for example. Conversely, when current flows from the drain of the pass gate transistor to the source of the pass gate transistor, the pass gate transistor, as a whole, is associated with a lower effective resistance than when current flows from the source of the pass gate transistor to the drain of the pass gate transistor, thus improving the alpha ratio, for example. In some embodiments, the second transistor 220 is configured as a pass gate transistor. In an example, the first region 222 is a drain of the second transistor 220 and the second region 226 is a source of the second transistor 220. In this example, a second gate to gate distance 286 is selected to be greater than a first gate to gate distance 284. Accordingly, since a gate to gate distance of a transistor is associated with an effective resistance for a corresponding portion of the transistor, a second drain effective resistance associated with the first gate to gate distance 284 is greater than a second source effective resistance associated with the second gate to gate distance 286. In this way, the effective resistance of the second transistor 220 is greater during a read operation for the pass gate transistor and smaller during a write operation for the pass gate transistor, such as the second transistor 220.

In some embodiments, a second effective resistance of the second transistor 220 is selected based on at least one of the first gate to gate distance 284 or the second gate to gate distance 286. For example, when the first gate to gate distance 284 and the second gate to gate distance 286 are both increased or selected to be larger, a higher strain effect is associated with the second transistor 220, thus reducing the second effective resistance of the second transistor 220. Conversely, when the first gate to gate distance 284 and the second gate to gate distance 286 are both decreased or selected to be smaller, a lower strain effect is associated with the second transistor 220, thus increasing the second effective resistance of the second transistor 220. As an example, the first region 222 of the second transistor 220 is a drain of the second transistor 220 and the second region 226 of the second transistor 220 is a source of the second transistor 220. In this example, when the first gate to gate distance 284 is decreased, a lower strain effect is associated with the drain, thus increasing a second drain effective resistance of the second transistor 220. When the first gate to gate distance 284 is increased, a higher strain effect is associated with the drain, thus decreasing the second drain effective resistance of the second transistor 220. Additionally, when the second gate to gate distance 286 is increased, a higher strain effect is associated with the source, thus reducing a second source effective resistance of the second transistor 220. Conversely, when the second gate to gate distance 286 is decreased, a lower strain effect is associated with the source, thus increasing the second source effective resistance of the second transistor 220. In this way, at least one of the first gate to gate distance 284 or the second gate to gate distance 286 is adjusted to control at least one of the second effective resistance, the second source effective resistance, or the second drain effective resistance. It will be appreciated that the second gate to gate distance 286 or the third gate to gate distance 288 are selected in a similar fashion to determine at least one of a third effective resistance, a third source effective resistance, a third drain effective resistance, etc. in some embodiments.

It will be appreciated that the second effective resistance impacts at least one of an alpha ratio or a beta ratio based on a configuration of the second transistor 220. For example, when the second transistor is configured as a pull up transistor, an increase in the second effective resistance reduces the alpha ratio. Additionally, when the second transistor is configured as a pull down transistor, a decrease in the second effective resistance increases the beta ratio. In some embodiments, when the second transistor is configured as a pass gate transistor, an increase or decrease in the second effective resistance affects at least one of the alpha ratio or the beta ratio in a proportional manner. In some embodiments, the second effective resistance is based on at least one of the second source effective resistance, the second drain effective resistance, or a direction of operation of the second transistor 220. For example, when the second drain effective resistance is greater than the second source effective resistance, the second effective resistance changes based on an operation mode, such as a forward operation or a reverse operation of the second transistor 220. In some embodiments, the alpha ratio and the beta ratio are based on or proportional to an effective resistance of a pass gate transistor, and a larger beta ratio and a smaller alpha ratio are achieved. Therefore, by configuring the second drain effective resistance to be greater than the second source effective resistance, the second transistor 220 comprises a higher second effective resistance during a read operation at least because the second transistor 220 is in a reverse operation mode. Accordingly, the higher second effective resistance facilitates a higher beta ratio. Additionally, the second transistor 220 comprises a lower second effective resistance during a write operation at least because the second transistor 220 is in a forward operation mode. Accordingly, the lower second effective resistance facilitates a lower alpha ratio. In this way, the alpha ratio and the beta ratio are improved in a concurrent manner at least because the second transistor 220 is configured to have a variable resistance based on an operation being performed, such as a read operation or a write operation. In other words, the second transistor 220 comprises a higher effective resistance while performing a read operation and a lower effective resistance while performing a write operation, for example.

In some embodiments, a transistor is arranged relative to another transistor based on at least one of a width, length, or width to length ratio the transistor. For example, in FIG. 2, the second transistor 220 is arranged adjacent to the third transistor 230. In some embodiments, the second transistor 220 is positioned adjacent to the third transistor 230 at least because the second transistor 220 and the third transistor share a common width 262 and 272. In other words, the second transistor 220 is arranged next to the third transistor 230 at least because the second width 262 of the second transistor 220 is equal to the third width 272 of the third transistor 230.

Figure 3:
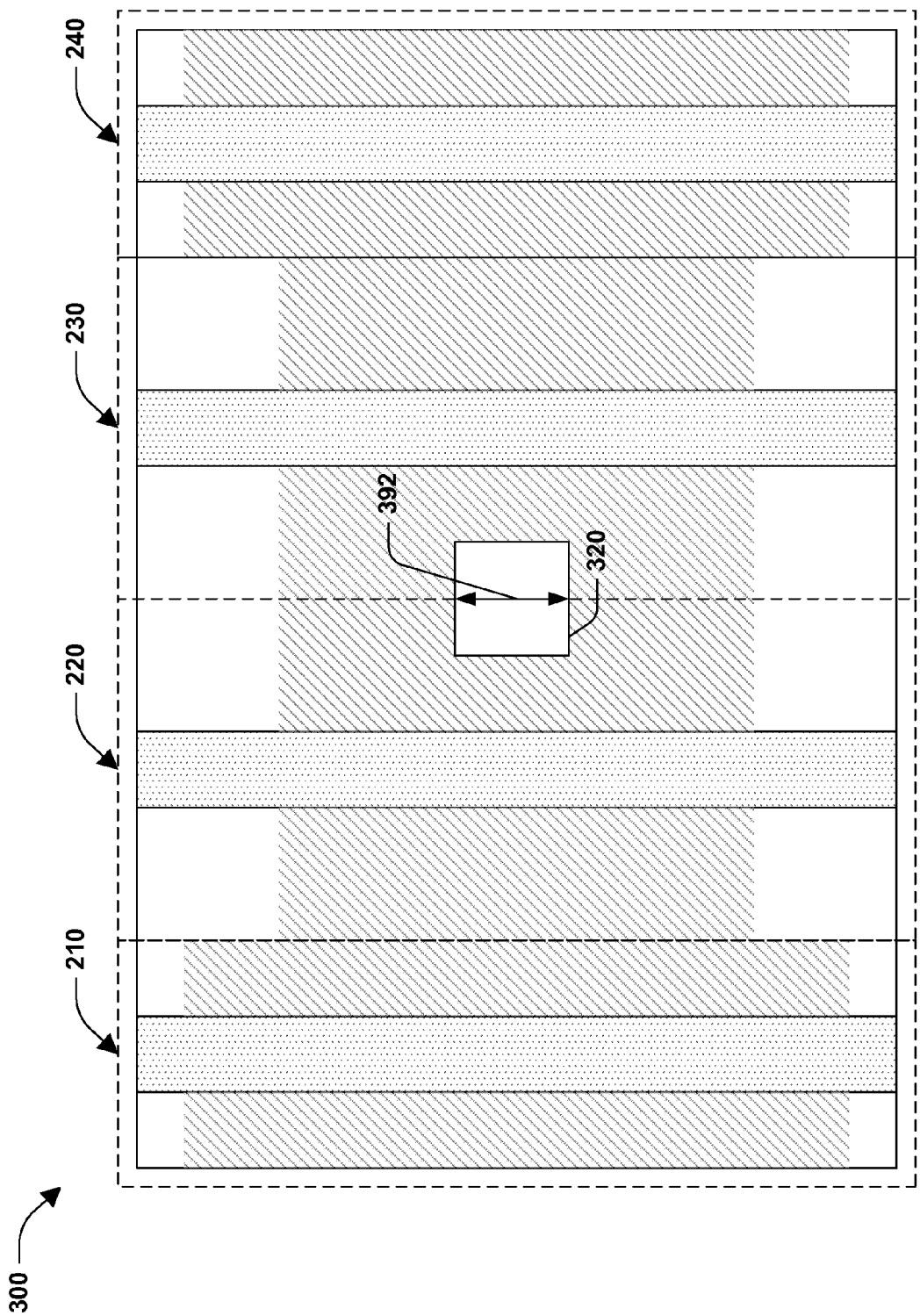
FIG. 3 is a top-down or layout view of an example transistor array of a cell, according to some embodiments.
Figure 4:
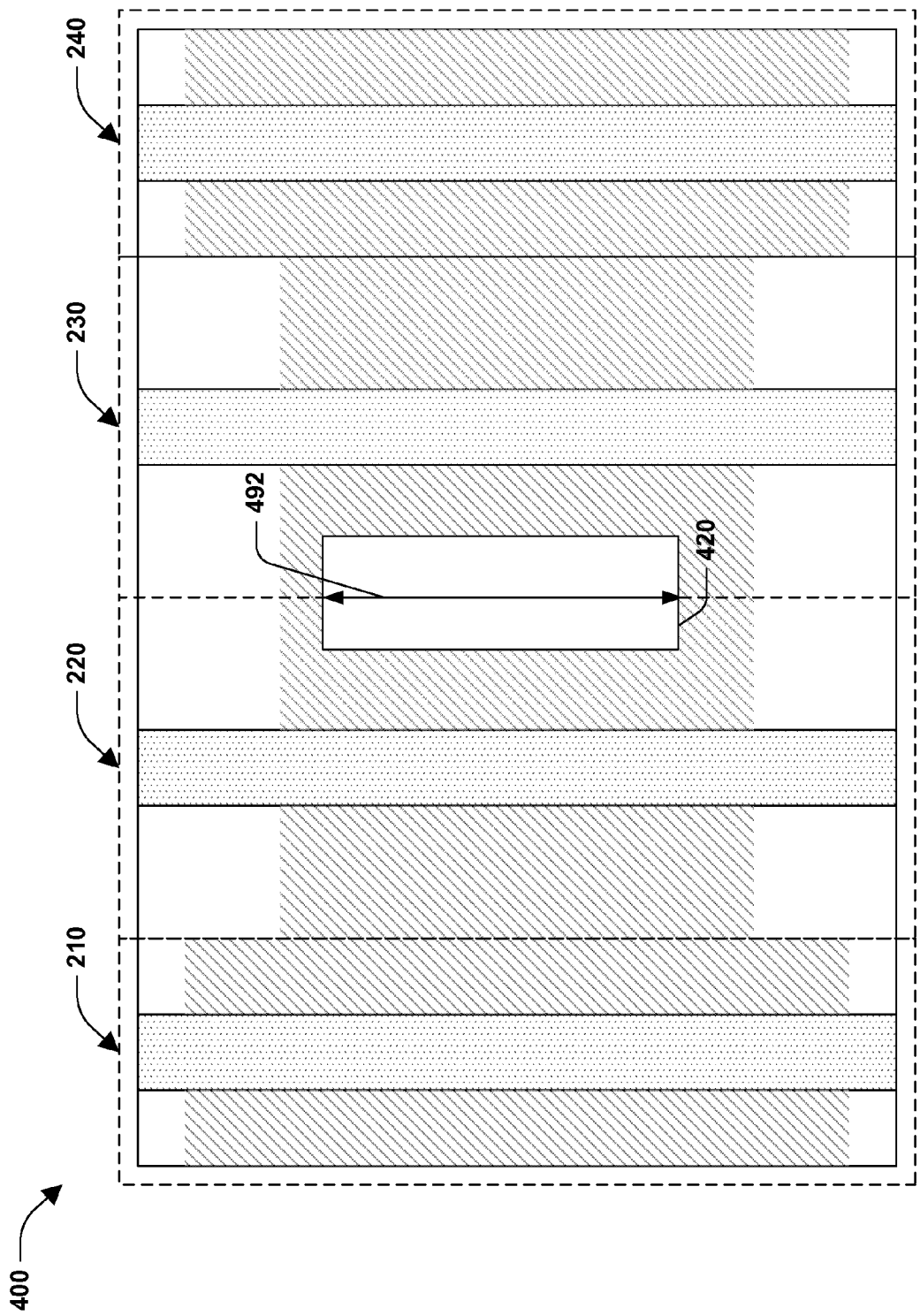
FIG. 4 is a top-down or layout view of an example transistor array of a cell, according to some embodiments.

FIG. 3 is a top-down or layout view of an example transistor array 300 of a cell, such as a static random access memory (SRAM) cell, according to some embodiments. Similarly, FIG. 4 is a top-down or layout view of an example transistor array 400 of a memory cell, such as a static random access memory (SRAM) cell, according to some embodiments. The transistor array 300 of FIGS. 3 and 400 of FIG. 4 comprise four transistors, such as a first transistor 210, a second transistor 220, a third transistor 230, and a fourth transistor 240. The transistor array 300 of FIG. 3 comprises a contact 320 comprising a contact width 392. The transistor array 400 of FIG. 4 comprises a contact 420 comprising a contact width 492. It will be appreciated that the contact width 492 of the contact 420 of FIG. 4 is different than the contact width 392 of the contact 320 of FIG. 3. In some embodiments, an increase in the contact width, such as contact 492 is associated with an increase in contact area, thus resulting in a higher compressive contact and a reduced effective resistance for corresponding transistors, such as the second transistor 220 and the third transistor 230, for example. Similarly, it will be appreciated that, an increase or decrease in a contact length is associated with an increase or decrease in contact area, thus resulting in a higher or lower compressive contact and a reduced or increased effective resistance for corresponding transistors. Therefore, a second effective resistance of the second transistor 220 and a third effective resistance of the third transistor 230 are reduced when a contact width is increased, such as from contact width 392 to contact width 492, for example. It will be appreciated that other features associated with the contact 420 are selected to adjust respective effective resistances in other embodiments. For example, such features comprise at least one of a tensile stress, compressive contact process, a shape of the contact 420, an area of the contact 420, a material of the contact 420, induced stress, strain stress, a stress booster, etc. Generally, an increase in the area of the contact 420 results in a decrease in an effective resistance for one or more corresponding transistors.

Figure 5:
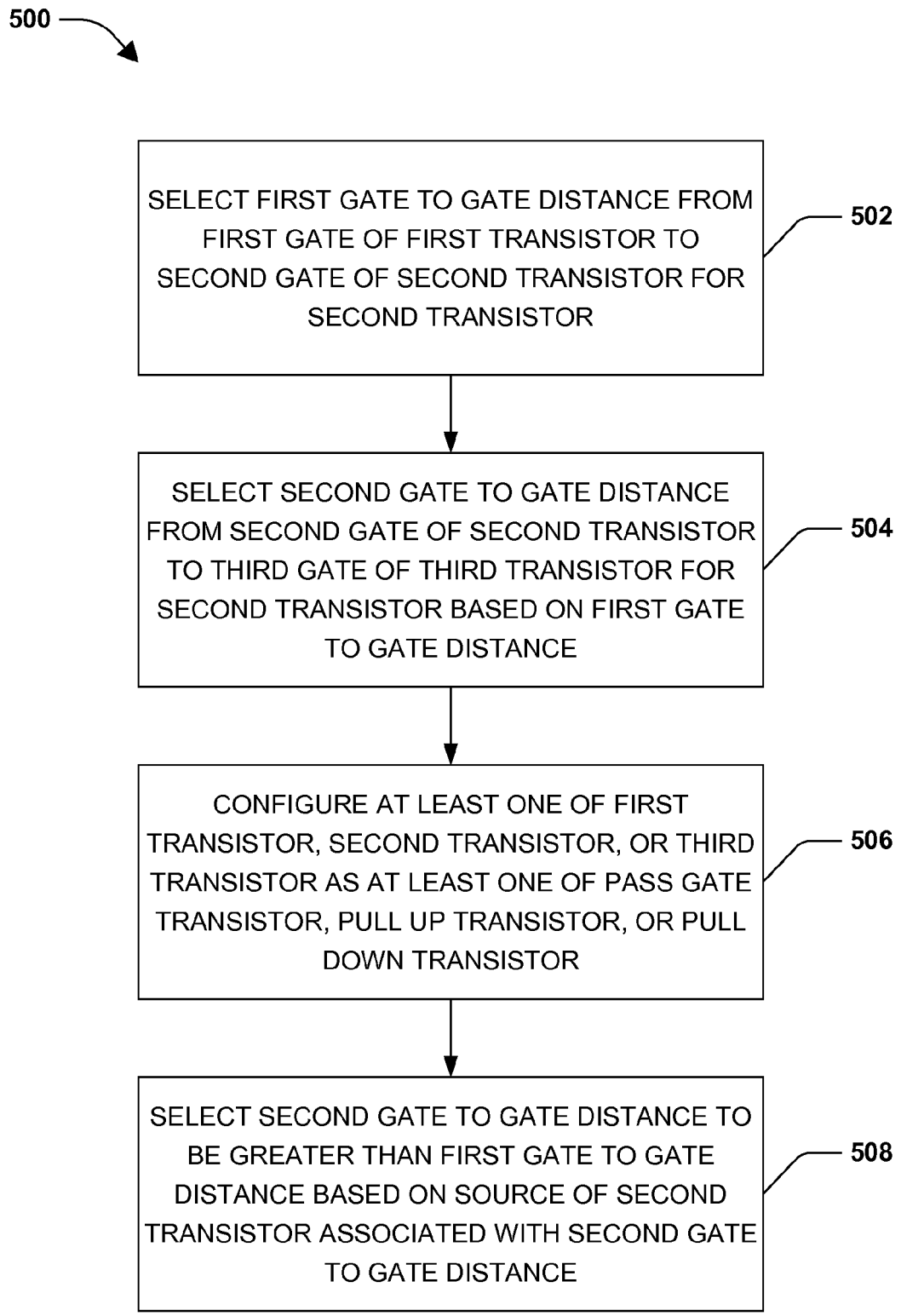
FIG. 5 is a flow diagram of an example method for designing a cell, according to some embodiments.

FIG. 5 is a flow diagram of an example method 500 for designing a cell, such as a static random access memory (SRAM) cell, according to some embodiments. For example, at 502, a first gate to gate distance for a second transistor is selected. The first gate to gate distance is a distance from a first gate of a first transistor to a second gate of the second transistor. At 504, a second gate to gate distance for the second transistor is selected based on the first gate to gate distance. The second gate to gate distance is a distance from the second gate of the second transistor to a third gate of a third transistor. In some embodiments, at least one of the first transistor, the second transistor, or the third transistor are configured as at least one of a pass gate transistor, a pull up transistor, or a pull down transistor at 506. In some embodiments, the method comprises selecting at least one of the first gate to gate distance or the second gate to gate distance based on at least one of an anticipated second source effective resistance or an anticipated second drain effective resistance. In other words, a gate to gate distance is selected to control at least one of a second source effective resistance or a second drain effective resistance which are generally anticipated or estimated during selection, at least because selection generally occurs during a design phase for the SRAM cell.

In some embodiments, an effective resistance of a transistor is associated with a source effective resistance and a drain effective resistance. Additionally, the source effective resistance and the drain effective resistance are associated with at least one of a first gate to gate distance or a second gate to gate distance, such as the first gate to gate distance 284 or the second gate to gate distance 286 of FIG. 2, for example. Accordingly, in some embodiments, a second effective resistance is selected for the second transistor based on at least one of the first gate to gate distance or the second gate to gate distance. In some embodiments, the drain effective resistance is greater than the source effective resistance. Therefore, a second gate to gate distance is selected to be different than a first gate to gate distance, at least because the second gate to gate distance corresponds to at least one of the drain effective resistance or the source effective resistance and the first gate to gate distance corresponds to at least one of the drain effective resistance or the source effective resistance. For example, at 508, when the second gate to gate distance is associated with a source of the second transistor, the second gate to gate distance is selected to be greater than the first gate to gate distance at least because such a selection enables the drain effective resistance to be greater than the source effective resistance. Accordingly, when the drain effective resistance to be greater than the source effective resistance and the corresponding transistor is configured as a pass gate transistor, an effective resistance of the pass gate transistor is larger when the pass gate transistor performs a read operation and smaller when the pass gate transistor performs a write operation. In this way, an asymmetrical design for the second transistor associated with the second gate to gate distance and the first gate to gate distance enables improvement for an alpha ratio and a beta ratio for an SRAM cell comprising the pass gate transistor in a concurrent fashion.

Figure 6:
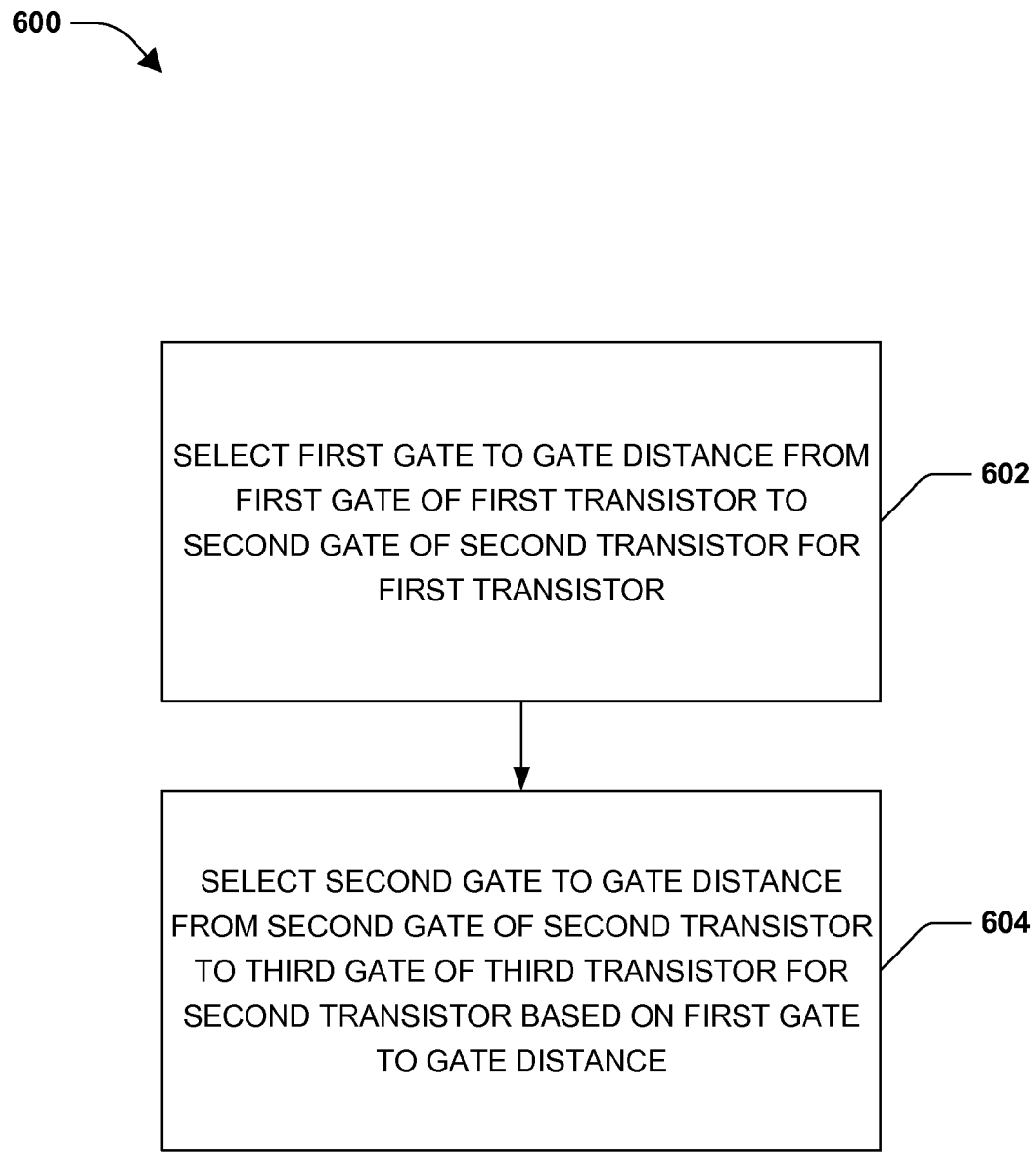
FIG. 6 is a flow diagram of an example method for designing a cell, according to some embodiments.

FIG. 6 is a flow diagram of an example method 600 for designing a cell, such as a static random access memory (SRAM) cell, according to some embodiments. At 602, the method comprises selecting a first gate to gate distance for a first transistor, the first gate to gate distance from a first gate of the first transistor to a second gate of a second transistor. At 604, the method comprises selecting a second gate to gate distance for the second transistor based on the first gate to gate distance, the second gate to gate distance from the second gate of the second transistor to a third gate of a third transistor.

Accordingly, the first gate to gate distance is associated with the first transistor and the second gate to gate distance is associated with the second transistor. In some embodiments, adjusting a gate to gate distance of a transistor changes at least one of an effective resistance of the transistor, a source effective resistance of the transistor, or a drain effective resistance of the transistor. Therefore, selecting the second gate to gate distance for the second transistor based on the first gate to gate distance enables selection of a second effective resistance for the second transistor based on a first effective resistance for the first transistor. In this way, an effective resistance ratio between the first transistor and the second transistor is selected, for example. Accordingly, at least one of an alpha ratio or a beta ratio are selected, at least because at least one of the alpha ratio or the beta ratio is based on the effective resistance ratio.

Figure 7:
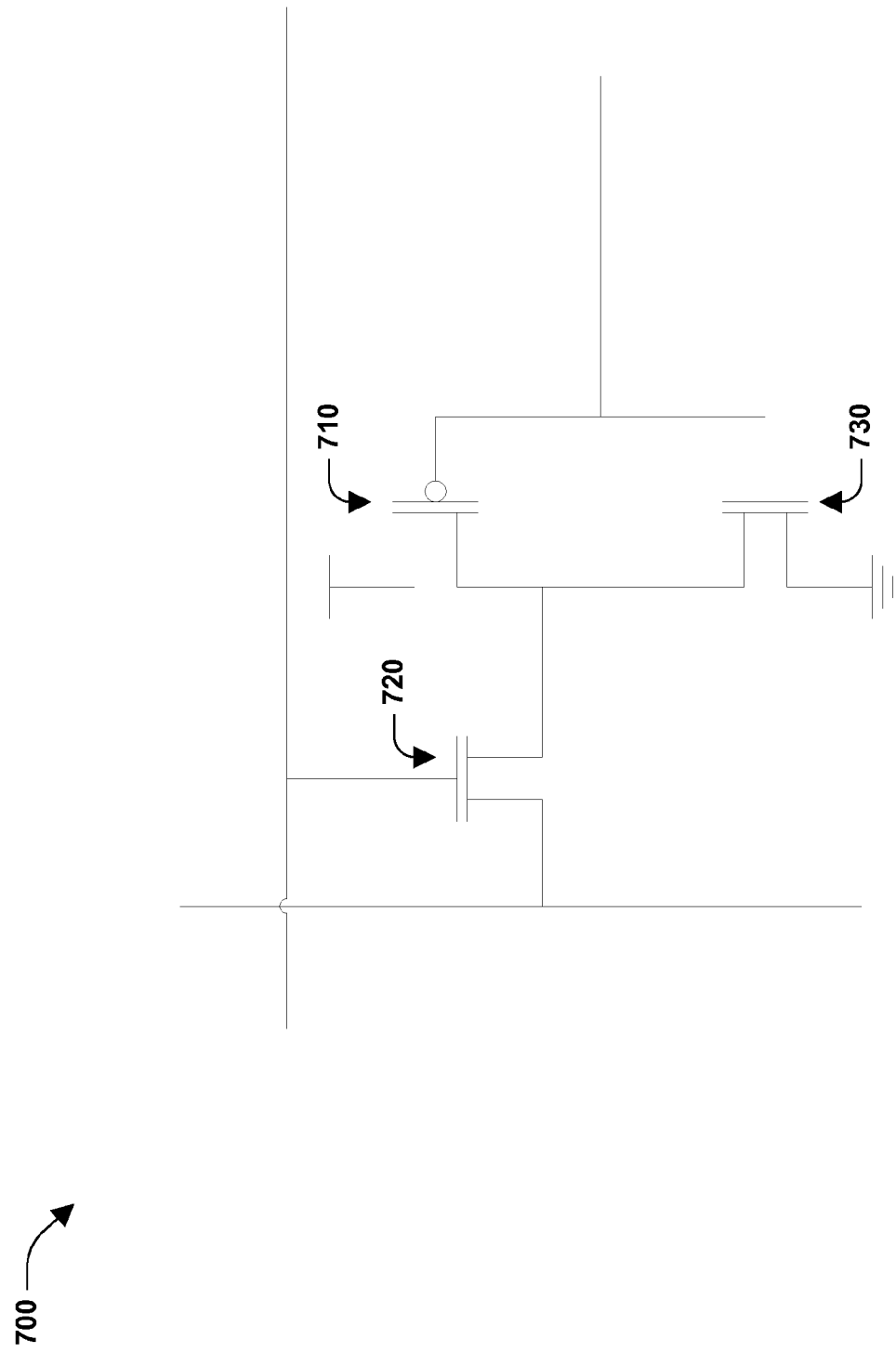
FIG. 7 is a schematic diagram of an example circuit, according to some embodiments.

FIG. 7 is a schematic diagram of an example circuit 700, according to some embodiments. Circuit 700 is a portion of a memory cell, and is used to illustrate a pull up transistor 710, a pull down transistor 730, and a pass gate transistor 720. For example, the pass gate transistor 720 is connected to at least one of the pull up transistor 710 or the pull down transistor 730.

Figure 8:
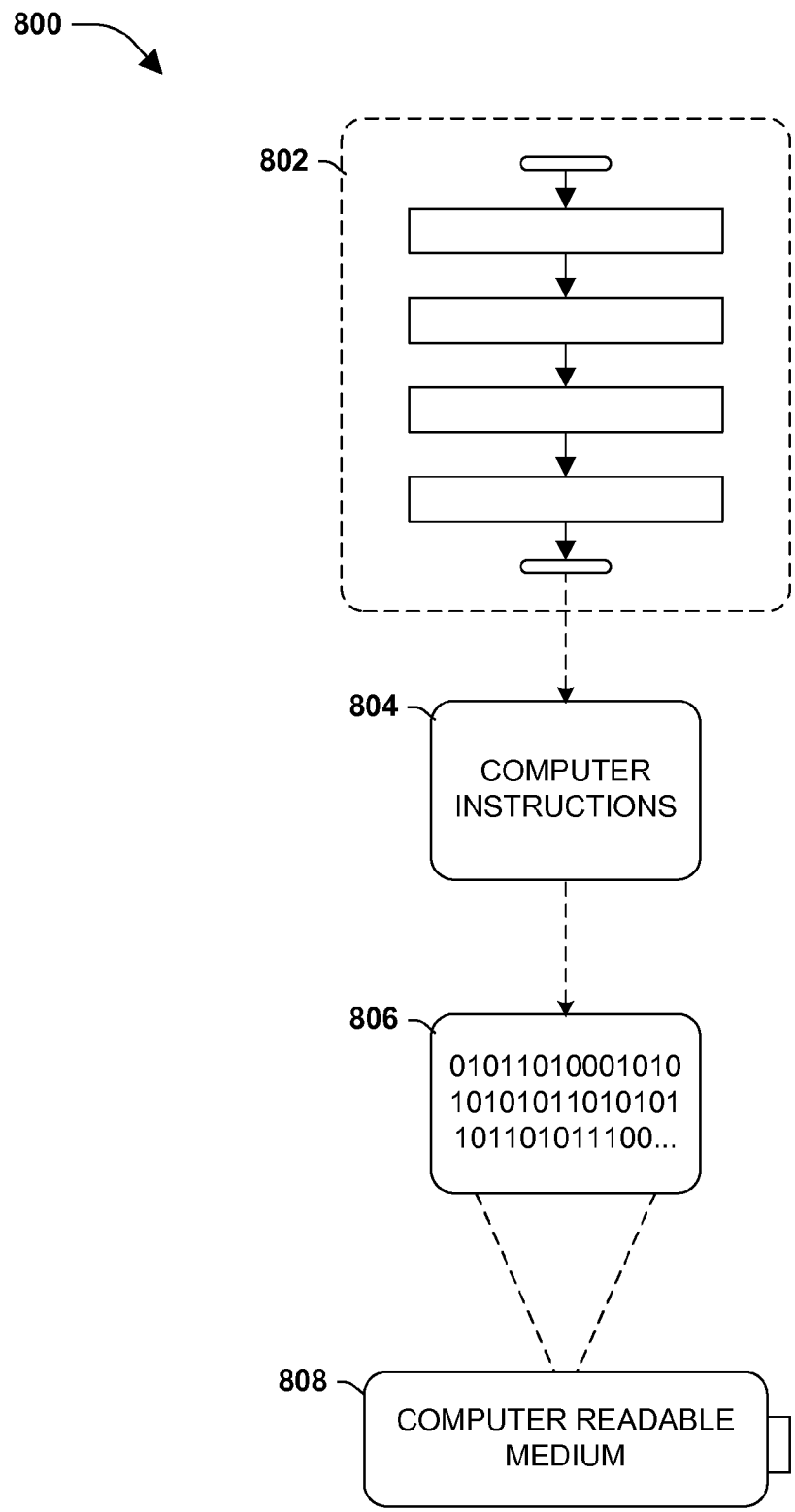
FIG. 8 is an illustration of an example computer-readable medium or computer-readable device comprising processor-executable instructions configured to embody one or more of the provisions set forth herein, according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 8, wherein the implementation 800 comprises a computer-readable medium 808, such as a CD-R, DVD-R, flash drive, a platter of a hard disk drive, etc., on which is encoded computer-readable data 806. This computer-readable data 806, such as binary data comprising a plurality of zero's and one's as shown in 806, in turn comprises a set of computer instructions 804 configured to operate according to one or more of the principles set forth herein. In one such embodiment 800, the processor-executable computer instructions 804 are configured to perform a method 802, such as at least some of the exemplary method 500 of FIG. 5 or at least some of the exemplary method 600 of FIG. 6, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 9:
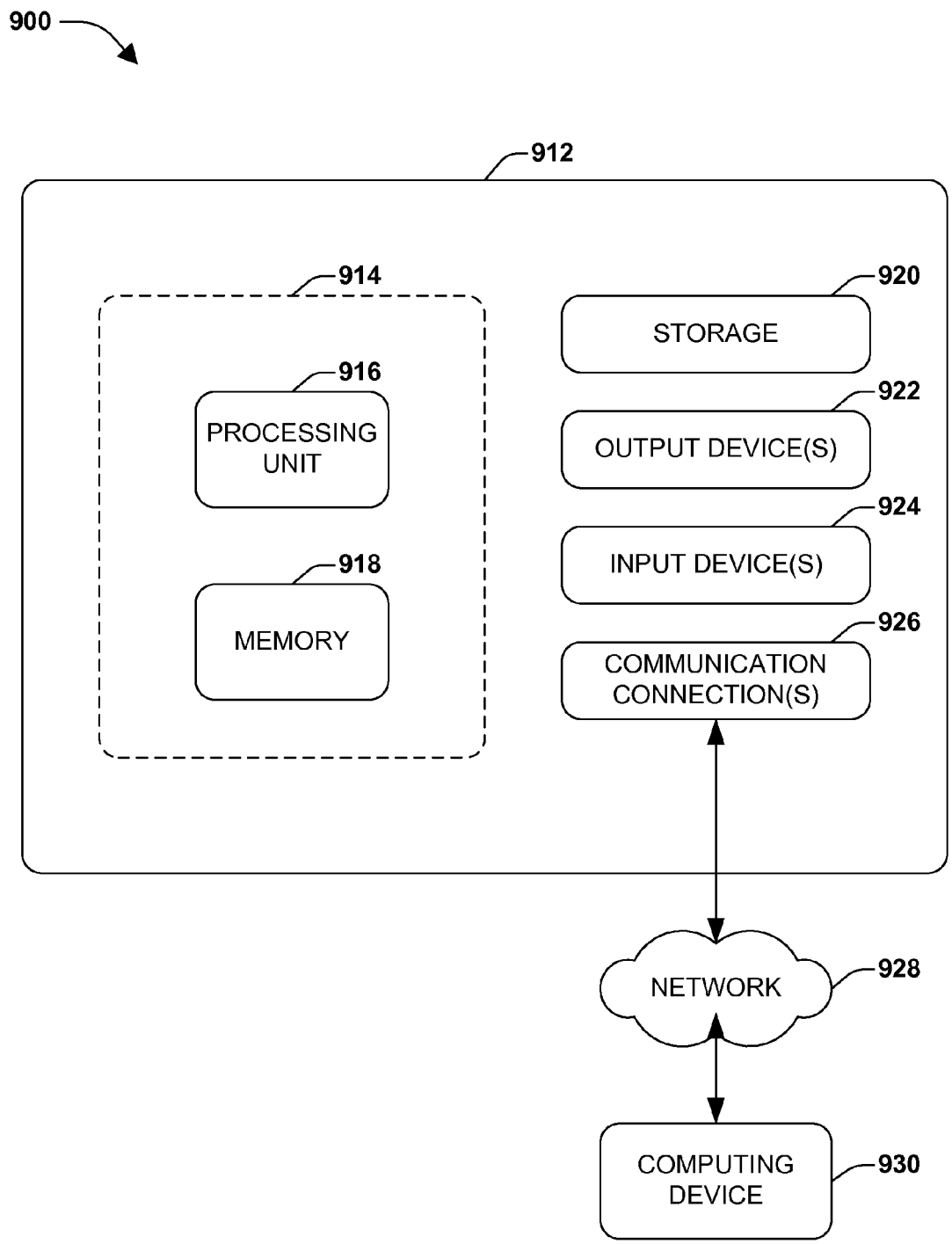
FIG. 9 is an illustration of an example computing environment where one or more of the provisions set forth herein are implemented, according to some embodiments.

FIG. 9 and the following discussion provide a description of a suitable computing environment to implement embodiments of one or more of the provisions set forth herein. The operating environment of FIG. 9 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 9 illustrates an example of a system 900 comprising a computing device 912 configured to implement one or more embodiments provided herein. In one configuration, computing device 912 includes at least one processing unit 916 and memory 918. Depending on the exact configuration and type of computing device, memory 918 may be volatile, such as RAM, non-volatile, such as ROM, flash memory, etc., or some combination of the two. This configuration is illustrated in FIG. 9 by dashed line 914.

In other embodiments, device 912 includes additional features or functionality. For example, device 912 also includes additional storage such as removable storage or non-removable storage, including, but not limited to, magnetic storage, optical storage, and the like. Such additional storage is illustrated in FIG. 9 by storage 920. In some embodiments, computer readable instructions to implement one or more embodiments provided herein are in storage 920. Storage 920 also stores other computer readable instructions to implement an operating system, an application program, and the like. Computer readable instructions are loaded in memory 918 for execution by processing unit 916, for example.

The term "computer readable media" as used herein includes computer storage media. Computer storage media includes volatile and nonvolatile, removable and non-removable media implemented in any method or technology for storage of information such as computer readable instructions or other data. Memory 918 and storage 920 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 912. Any such computer storage media is part of device 912.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 912 includes input device(s) 924 such as keyboard, mouse, pen, voice input device, touch input device, infrared cameras, video input devices, or any other input device. Output device(s) 922 such as one or more displays, speakers, printers, or any other output device are also included in device 912. Input device(s) 924 and output device(s) 922 are connected to device 912 via a wired connection, wireless connection, or any combination thereof. In some embodiments, an input device or an output device from another computing device are used as input device(s) 924 or output device(s) 922 for computing device 912. Device 912 also includes communication connection(s) 926 to facilitate communications with one or more other devices.

According to some aspects, a transistor array of a cell is provided, comprising a first transistor comprising a first gate. For example, the first transistor is associated with a first gate to gate distance from the first gate of the first transistor to a second gate of a second transistor. In some embodiments, the transistor array of the cell comprises the second transistor comprising the second gate. For example, the second transistor is associated with the first gate to gate distance from the first gate of the first transistor to the second gate of the second transistor and a second gate to gate distance from the second gate of the second transistor to a third gate of a third transistor. Additionally, the transistor array of the cell comprises the third transistor comprising the third gate. For example, the third transistor is associated with the second gate to gate distance from the second gate of the second transistor to the third gate of the third transistor, the first gate to gate distance different than the second gate to gate distance.

According to some aspects, a method for designing a cell is provided, comprising selecting a first gate to gate distance for a second transistor, the first gate to gate distance from a first gate of a first transistor to a second gate of the second transistor. In some embodiments, the method comprises selecting a second gate to gate distance for the second transistor based on the first gate to gate distance, the second gate to gate distance from the second gate of the second transistor to a third gate of a third transistor.

According to some aspects, a method for designing a cell is provided, comprising selecting a first gate to gate distance for a first transistor, the first gate to gate distance from a first gate of the first transistor to a second gate of a second transistor. In some embodiments, the method comprises selecting a second gate to gate distance for the second transistor based on the first gate to gate distance, the second gate to gate distance from the second gate of the second transistor to a third gate of a third transistor.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A transistor array of a cell, comprising:
    a first transistor comprising:
        a first gate, and
        a first region having a first length, the first region comprising at least one of a first source or a first drain; and
    a second transistor comprising:
        a second gate, and
        a second region abutting the first region, the second region having a second length different than the first length, the second region comprising at least one of a second source or a second drain, wherein:
            a ratio of the first length to the second length is a function of at least one of a desired alpha ratio for the transistor array or a desired beta ratio for the transistor array.

2. The transistor array of the cell of claim 1, the first region having a first width and the second region having a second width different than the first width.

3. The transistor array of the cell of claim 2, the first transistor comprising a pull up transistor and the second transistor comprising a pass gate transistor and wherein the desired alpha ratio is equal to a first ratio between the first width and the first length divided by a second ratio between the second width and the second length.

4. The transistor array of the cell of claim 2, the first transistor comprising a pull down transistor and the second transistor comprising a pass gate transistor and wherein the desired beta ratio is equal to a first ratio between the first width and the first length divided by a second ratio between the second width and the second length.

5. The transistor array of the cell of claim 1, the first transistor comprising a third region having a third length substantially equal to the first length, the third region different than the first region and comprising at least one of the first source or the first drain.

6. The transistor array of the cell of claim 5, the second transistor comprising a fourth region having a fourth length substantially equal to the second length, the fourth region different than the second region and comprising at least one of the second source or the second drain.

7. The transistor array of the cell of claim 5, the first region having a first width and the third region having a third width substantially equal to the first width.

8. A transistor array of a cell, comprising:
    a first transistor comprising:
        a first region having a first width, the first region comprising at least one of
        a first source or a first drain;
    a second transistor abutting the first transistor and comprising:
        a second region having a second width different than the first width, the second region comprising at least one of a second source or a second drain; and
    a third transistor abutting the second transistor and comprising:
        a third region different than the second region and having the second width, the third region comprising at least one of a third source or a third drain.

9. The transistor array of the cell of claim 8, wherein:
    the first region has a first length and the second region has a second length different than the first length.

10. The transistor array of the cell of claim 8, wherein:
    the first region has a first length and the third region has a second length different than the first length.

11. The transistor array of the cell of claim 8, wherein:
    the second region and the third region have a same length.

12. The transistor array of the cell of claim 8, wherein:
    the first region has a first length,
    the second region has a second length different than the first length; and
    the third region has the second length.

13. The transistor array of the cell of claim 12, wherein the first width, the first length, the second width, and the second length are selected as a function of at least one of a desired alpha ratio of the transistor array or a desired beta ratio of the transistor array.

14. The transistor array of the cell of claim 8, comprising:
    a fourth transistor abutting the third transistor and comprising:
        a fourth region having the first width, the fourth region comprising at least one of a fourth source or a fourth drain.

15. The transistor array of the cell of claim 14, wherein:
    the first region and the fourth region have a first length, and
    the second region and the third region have a second length different than the first length.

16. The transistor array of the cell of claim 8, comprising:
    a contact between the second transistor and the third transistor.

17. The transistor array of the cell of claim 8, wherein a ratio of the first width to the second width is a function of at least one of a desired alpha ratio for the transistor array or a desired beta ratio for the transistor array.

18. A transistor array of a cell, comprising:
    a first transistor comprising a first region having a first set of dimensions, the first region comprising at least one of a first source or a first drain;
    a second transistor comprising:

a second region abutting the first region and having a second set of dimensions, the second set of dimensions differing from the first set of dimensions in at least one of width or length; and a third region having the second set of dimensions, the second region comprising at least one of a second source or a second drain and the third region comprising at least one of the second source or the second drain; and a third transistor comprising a fourth region abutting the third region and having the second set of dimensions, the fourth region comprising at least one of a third source or a third drain.

19. The transistor array of the cell of claim 18, comprising:

a fourth transistor comprising a fifth region abutting the fourth region and having the first set of dimensions, the fifth region comprising at least one of a fourth source or a fourth drain.

20. The transistor array of the cell of claim 18, wherein at least some of the first set of dimensions or the second set of dimensions are selected as a function of at least one of a desired alpha ratio of the transistor array or a desired beta ratio of the transistor array.

\* \* \* \* \*